(12) United States Patent
Wheland et al.

(10) Patent No.: US 7,493,743 B2
(45) Date of Patent: Feb. 24, 2009

(54) PACKAGES FOR ALKANES HAVING ULTRA-HIGH TRANSPARENCY AT 193 NM

(75) Inventors: Robert Clayton Wheland, Wilmington, DE (US); Curtis R. Fincher, Wilmington, DE (US); Roger Harquail French, Wilmington, DE (US); Sheng Peng, Hockessin, DE (US); Weiming Qiu, Wilmington, DE (US)

(73) Assignee: E.I. du Pont de Nemours and Company, Wilmington, DE (US)

(*) Notice: Subject to any disclaimer, the term of this patent is extended or adjusted under 35 U.S.C. 154(b) by 575 days.

(21) Appl. No.: 11/070,918

(22) Filed: Mar. 2, 2005

(65) Prior Publication Data

US 2006/0196801 A1    Sep. 7, 2006

(51) Int. Cl.
*B65B 31/02*    (2006.01)
(52) U.S. Cl. .......................................... 53/432; 53/510
(58) Field of Classification Search ............ 53/431, 53/432, 510; 206/524
See application file for complete search history.

(56) References Cited

U.S. PATENT DOCUMENTS

| | | | |
|---|---|---|---|
| 4,234,690 A * | 11/1980 | Weinstein et al. ........... 435/119 |
| 4,362,250 A | 12/1982 | Cottingham et al. | |
| 4,871,087 A | 10/1989 | Johnson | |
| 6,177,160 B1 * | 1/2001 | Snow ........................ 428/35.7 |
| 6,710,012 B2 * | 3/2004 | Funke et al. .................. 53/432 |
| 2005/0286031 A1 * | 12/2005 | French et al. ................. 355/30 |

FOREIGN PATENT DOCUMENTS

| | | |
|---|---|---|
| JP | 56 74439 | 6/1981 |
| WO | 2005/013009 A | 2/2005 |
| WO | 2005/087693 A2 | 9/2005 |
| WO | 2005/119371 A | 12/2005 |

OTHER PUBLICATIONS

U.S. Appl. No. 60/575,982, filed Jun. 1, 2004, Roger Harquail French et al.
U.S. Appl. No. 60/614,747, filed Sep. 29, 2004, Roger Harquail French et al.
Rohwer et. al., Preparation and Storage of Ultra High Purity Hexane for Solvent Effect Gas Chromatographic Analysis, J. High Res. Chrom., 1993, p. 561-564, vol. 16.
Aldrich Chemical Company, Inc., "The Aldrich Pure-Pactm System", Aldrich Technical Bulletins, No. AL-201, Nov. 2004, pp. 1-10.
International Search Report for International Application No. PCT/US2006/007590 Dated Nov. 14, 2006.

* cited by examiner

*Primary Examiner*—Louis K Huynh

(57) ABSTRACT

A method for preparing packages holding liquid alkanes exhibiting high transparency and photochemical stability at wavelength of about 193 nm, wherein a sealable vessel is flushed with an inert gas to form an atmosphere of inert gas, a liquid alkane is charged into the vessel in the atmosphere of inert gas, and the charged vessel is sealed.

8 Claims, No Drawings

PACKAGES FOR ALKANES HAVING ULTRA-HIGH TRANSPARENCY AT 193 NM

FIELD OF THE INVENTION

The present invention is directed to packages for the storing of liquid alkanes having ultra-low spectroscopic absorbance at 193 nm wavelength, and to methods for making the packages. The packages can maintain the desired properties of the alkanes over periods of months in duration.

BACKGROUND OF THE INVENTION

Disclosed in co-pending U.S. patent applications Ser. Nos. 60/575982 and 60/614747 are alkanes having absorbance of 0.01 to 1.0 $cm^{-1}$ at a wavelength of 193 nm and methods for their preparation. Alkanes of such low aborbance are highly suitable for use as immersion fluids in the new field of immersion photolithography. Disclosed therein are methods which combine distillation, contact with a variety of adsorbents, and handling in an oxygen-minimized atmosphere which are required to achieve the unprecedented high levels of transparency of the alkanes provided therein.

As a general rule, fabricators of electronic chips do not wish to develop capabilities in chemical purification on site. It is insufficient, therefore, to prepare such highly transparent alkanes for use in electronics fabrication and other critical uses if the very high transparency levels which make them useful cannot be maintained during shipment and subsequent storage in the customer's fabrication facility.

H. Hirata et al, JP(Kokai)56-74439, discloses use of adsorbents in contact with hydrocarbon fuels—comprising substantially alkanes—in a storage container for said fuels, the purpose of the adsorbents being to maintain the purity and fuel value of said fuels. The purpose of the adsorbents is to remove oxidation products. No mention is made of the atmosphere. No attempt is made to exclude air.

Rohwer et al., J. High Res. Chrom., 16, pp. 561 ff, (1993) disclose "ultra-high purity" hexane prepared by fractional column distillation. In a study to establish the influence of storage conditions on maintenance of hexane purity it is concluded that "purging with inert gas" did "not appreciably alter shelf life" and is discouraged because of added possibilities of contamination.

In Technical Bulletin AL-134, Aldrich Chemical Company discusses handling of the air-sensitive reagents borane complexes, organoboranes, borohydrides, Grignard reagents, and organo-aluminums, lithiums, and zincs using special sealed bottles which exclude oxygen. The bottles are flushed with nitrogen before filling.

Containers for volatile and reactive reagents, including those sensitive to the air are known in the art. Technical Bulletin AL-136 of the Aldrich Chemical Company describes the "Sure/Pac(™)" cylinder system, a brass or stainless steel vessel for storing highly reactive organo-metallics. Cottingham, U.S. Pat. No. 4,362,250 discloses a container for storing reactive or volatile material having a dual-neck seal. Also disclosed are Aldrich Sure-seal(™) glass bottles which are in common commercial use.

SUMMARY OF THE INVENTION

One aspect of the present invention is a package comprising a sealed vessel, said vessel having an inner surface, and a liquid alkane contained therein in contact with said inner surface. The liquid alkane has a spectroscopic absorbance at 193 nm of <1 $cm^{-1}$ and an oxygen concentration of less than about 2 ppm. The inner surface is of a material selected from glass, metal, and plastic and combinations thereof; and the inner surface is substantially free of alkane-soluble contaminants.

Another aspect of the invention is a method for packaging an alkane, the method comprising providing a sealable vessel having an inner surface, adding to the vessel a liquid alkane having a spectroscopic absorbance at 193 nm of less than 1 $cm^{-1}$ and an oxygen concentration of less than about 2 ppm, such that the liquid alkane contacts the inner surface of the vessel, and sealing the vessel.

These and other aspects of the present invention will be apparent to those skilled in the art in view of the following description and the appended claims.

DETAILED DESCRIPTION

In the present invention, unless otherwise expressly stated, the term "alkane" shall be understood to refer specifically and exclusively to a liquid consisting essentially of acylic or cyclic alkanes, branched or unbranched, or mixtures thereof. The cyclic alkanes suitable for the practice of the invention can contain one or more cyclobutane or larger rings with or without branches and can be interconnected in any fashion including linear, fused, bicyclic, polycyclic, and spiro arrangements.

The term "consisting essentially of" for the purposes of this invention shall mean that there is present no species in sufficient concentration to cause the alkane to depart from the property ranges herein defined. As explained hereinbelow, widely different levels of contaminants can be tolerable in the practice of the invention, depending upon their particular chemical identity.

Suitable for the practice of the present invention is a liquid consisting essentially of acylic or cyclic alkanes, branched or unbranched, or a mixture thereof. The liquid alkanes are characterized by absorbance of <1 $cm^{-1}$ at a wavelength of 193 nm, preferably 0.01 to 1 $cm^{-1}$, more preferably 0.01 to 0.5 $cm^{-1}$, most preferably 0.01 to 0.1 $cm^{-1}$. Using the method of Urbach, as disclosed in F. Urbach, *Physical Review*, 92, 1324, (1953); and M. E. Innocenzi, R. T. Swimm, M. Bass, R. H. French, A. B. Villaverde, M. R. Kokta, "Room Temperature Optical Absorption in Undoped-Al2O3", *Journal of Applied Physics*, 67, 12,7542-46 (1990 it has been estimated that some alkanes have an inherent absorption at 193 nm of about 0.001 $cm^{-1}$. While it is not intended that the scope of the present invention be limited thereto, it is contemplated that the application of the methods taught herein can, in principle, achieve absorptions at 193 nm substantially lower than the preferred ranges recited herein and approaching the inherent absorption of alkanes.

In order to achieve a desirably high level of transparency, spectroscopically absorbing impurities of whatever origin are removed to a greater degree than has heretofore been attempted in the art. However, impurities that are not spectroscopically absorbing at 193 nm can be present at concentrations as high as several tenths of a percent. It is preferred that any said non-absorbing impurities be of no greater volatility than the major alkane component in order to avoid bubble formation, and be fully soluble in the alkane component to prevent light scattering. Concentrations of non-absorbing impurities much above several tenths of a percent may also undesirably decrease the refractive index of the alkane. The packages described herein preserve the high transparency of the liquid alkane for months or longer.

Certain organic impurities such as aromatic rings, olefins, substituted cycloalkanes, branched alkanes, oxidation products such as peroxides and ketones, and the like may be present in even a so-called highly pure alkane as received from a commercial source. Some organic impurities are orders of magnitude more absorbing than other organic impurities such as cyclobutane. For example, alkanes suitable for the practice of the present invention may be contaminated by a percent or two of cyclobutane, which is quite transparent though of high vapor pressure and low refractive index. On the other hand, with more highly absorbing contaminants such as olefins and carbonyls it is preferred that the total concentration of spectroscopically absorbing contaminants in the alkane be <100 ppm by weight. In particularly severe instances, concentrations as low as 1 ppm can be detrimental.

According to the present invention, the inner surface of the vessel is substantially free of alkane-soluble contaminants. As discussed hereinabove, the degree of contamination that can be tolerated depends upon the particular contaminant in question. From the standpoint of operability of the present invention, the term "substantially free" shall be understood to mean that the degree of contamination of the liquid alkane as a result of contact with the inner surface of the vessel shall not exceed that required to increase absorbance at 193 nm by more than 0.1 $cm^{-1}$, preferably more than 0.01 $cm^{-1}$.

Preferred alkanes include cyclopentane, cyclohexane, cycloheptane, cyclooctane, decahydronapthalene, bicyclohexyl [1,1'-bicyclohexyl], n-pentane, n-hexane, n-heptane, n-octane, n-nonane, and n-decane, n-dodecane, n-tetradecane, n-hexadecane, 2-methylpentane, 3-methylpentane, 2,3-dimethylbutane, 2,2-dimethylbutane, n-octylcyclohexane, 2-ethylnorboranane, exo-tetrahydrodicyclopentadiene, and mixtures thereof. Cyclohexane, cyclopentane, cyclooctane, decahydronaphthalene, bicyclohexyl, and exo-tetrahdyrodicyclopentadiene are most preferred.

Many alkanes suitable for the practice of the present invention are available commercially at varying degrees of purity. Cyclohexane and cyclopentane in particular are available commercially in highly purified grades of 99.9% or higher. Prior to the present invention, use of even the highly purified commercial grades of these materials for immersion photolithography at 193 nm exposure wavelength was not contemplated because even in the available highly pure form, the absorbance, found to be 4.78 $cm^{-1}$ in the case of cyclohexane, was too high.

The alkane suitable for the practice of the present invention is further characterized by an oxygen concentration of less than 2 parts per million (ppm), preferably less than 0.1 ppm, more preferably less than 0.01 ppm dissolved in the liquid phase of the alkane.

It has been found in the practice of the present invention that alkanes having characteristics desirable for use according to the present invention are not available from conventional sources. As taught in copending U.S. patent applications 60/575982 and 60/614747, alkanes suitable for the present invention can be prepared by performing purification steps to remove and exclude oxygen as well as spectroscopically absorbing organic impurities. Suitable purification methods include fractional distillation, sparging, freeze-thaw cycling, zone refining, and treatment with adsorbents such as silica, molecular sieves of various pore sizes, carbon, silica gel, alumina, and combinations thereof.

In some instances, particularly if the commercial supplier has not already done so, it may be desirable to first subject the as-received compound, which may have a purity greater than 99%, to fractional distillation in the cleanest, grease-free distillation apparatus available. The heart cut of the distillate thus produced is then mixed in the liquid state with one or more adsorbents, which may include for example silica gel, 3A, and 5A zeolite molecular sieves, activated carbon, alumina, and mixtures thereof. All subsequent handling of the thus purified alkane is then performed in an oxygen-minimized, preferably nitrogen or helium, atmosphere. This includes the use thereof in immersion photolithography, which is advisedly performed in an oxygen-minimized, preferably nitrogen or helium, atmosphere.

Adsorbents are most effective if activated, preferably by heating while purging with a dry gas. It is preferable that adsorbent activation be done immediately prior to use. Activation of silica gel, a preferred adsorbent, or zeolites, can be achieved by heating to about 200 to 500° C. under a flow of dry, pure air, nitrogen, or helium for several hours. Air at 500° C. has the advantage of burning off most residual organic contaminants from silica gel and zeolites. The gas flow can be continued as the system cools down to a temperature in the range of room temperature to 100° C. In an alternative procedure the gas flow is stopped and the system sealed off. In another alternative procedure, the gas flow is stopped and the system evacuated as the adsorbent cools to a temperature in the range of room temperature (e.g., about 20° C. to about 25° C.) to 100° C. The advantage of stopping the gas flow while the adsorbent is at 500° C. is that this minimizes recontamination from any impurities in the gas as the adsorbent cools down.

A method found to be suitable for activating the silica gel and zeolite adsorbents is to charge a Hastelloy tube with adsorbent, followed by heating the tube in a clamshell furnace for two hours at 500° C. under an air flow. The air flow is stopped and the Hastelloy tube immediately sealed at both ends. Once the sealed Hastelloy tube has cooled to room temperature, it is transferred to a $N_2$ glove bag where the tube is opened and the adsorbent added to a bottle containing alkane liquid that is to be purified. While not preferred, the silica gel and zeolite adsorbents can also be allowed to cool under a nitrogen purge.

Although the ratio of adsorbent to liquid can be varied without limit, it has been found satisfactory to employ one volume of adsorbent for every 1 to 20 volumes of liquid.

It may be desirable to subject an as-received alkane to distillation prior to treatment with adsorbents. If distillation is undertaken, it is desirably performed in the cleanest, least contaminated distillation apparatus possible. It is particularly desirable to exclude oxygen and any adventitious or systemic organic contaminants. It has been found in the practice of the invention that employment of grease, including fluorinated greases, such as are commonly employed in distillation and vacuum systems to provide improved sealing and easier disassembly can contaminate the distillate sufficiently and increase the absorbance. It is therefore preferably to perform the distillation in what is herein designated a "grease-free" distillation system.

As used herein "grease-free" means that no grease should be employed when assembling the cleaned parts of the system. One of skill in the art will appreciate that the term "grease-free" does not mean that the invention is not operable should there be some small amount of grease contamination somewhere in the system. To the extent that the system can be cleaned of all such contamination, the better will be the absorbance, but "grease-free" shall not be taken for the purpose of the present invention to mean the complete absence of grease in no matter how small a concentration.

In a preferred embodiment, 99.9% pure commercially available cyclohexane is treated with silica gel under an inert gas that contains ≦5 ppm of oxygen, preferably <3 ppm oxygen, and most preferably <1 ppm oxygen. According to Henry's law, these oxygen concentrations correspond, at equilibrium, to parts per billion concentrations of oxygen in the alkane contained in the corresponding atmosphere. Suitable inert gases include nitrogen, argon, and helium. Nitrogen is preferred, although under handling conditions where bubble formation can occur, helium may be desirable because of helium's low solubility in fluids.

While in most instances it should be practical to purchase highly purified, distilled grades of alkanes suitable for the practice of the present invention so that treatment with an adsorbent such as silica gel is the only needed purification step, there may be instances wherein benefit can be derived by subjecting an as-received alkane to chemical analysis such as by gas chromatography/mass spectrometry in order to identify contaminants so that the best methodology for purification can be devised.

Methods known in the art for performing extractions of particular types of contaminants are suitable for the practice of the present invention, but it is highly desirable that such methods be executed under very clean conditions to avoid further contamination.

Sparging is a suitable method for removing oxygen. One method for sparging found effective is as follows: A glove box is supplied with dry, low-oxygen-content nitrogen, such as 99.998% nitrogen or more, such as is available as a cylinder gas from Matheson, or can be supplied by the boil-off of liquid nitrogen. A liquid alkane aliquot of about 10 ml is placed in a 20 ml glass scintillation vial. The aliquot is transferred into the nitrogen purged dry box. The vial is secured flat on a work surface, the plastic cap is removed from the vial, a disposable glass pipette lowered into the liquid and then the nitrogen described hereinabove is delivered via the pipette. Flow rate is adjusted to maintain vigorous bubbling of solvent, preferably without causing the liquid to splash out of the vial. Vigorous sparging is continued for 30-60 seconds, long enough to significantly decrease oxygen content and possibly water content without major loss of liquid to evaporation.

An alternative method for preparing the alkane is bulb-to-bulb distillation through a bed of 3A molecular sieves. For example, two flasks are connected by a tube containing 3A molecular sieves preheated as described above. One of the flasks is then partially filled with the liquid that is to be purified and the system resealed. The liquid is subjected to three freeze/thaw cycles to remove dissolved oxygen. The system is then thoroughly evacuated after refreezing the liquid with liquid nitrogen. The system is sealed under vacuum and the liquid nitrogen cooling bath transferred from the flask containing the liquid to the empty flask. As the liquid warms toward room temperature it distills through the bed of 3A molecular sieves to the chilled flask. Once distillation is complete the vacuum is relieved with oxygen free nitrogen, the purified liquid allowed to warm to room temperature, and the flask then valved off for subsequent use.

The liquid alkane prepared according to the methods herein described is characterized by absorbance at 193 nm of 0.01 to 1 $cm^{-1}$, preferably 0.01 to 0.5 $cm^{-1}$, most preferably 0.01 to 0.1 $cm^{-1}$, and a dissolved oxygen concentration in the liquid alkane of <2 ppm, preferably <0.1 ppm, and most preferably <0.01 ppm. To improve the utility of the thus prepared liquid alkane it is desirable to devise a method for containment that allows for the preservation of the desired properties of the alkane for extended periods of time with little or no degradation. Such a development permits the preparation of the liquid alkane at one location, and use thereof at another location some time after the preparation thereof.

In preferred embodiments, a liquid alkane having an absorbance at 193 nm of 0.01 to 1 $cm^{-1}$, preferably 0.01 to 0.5 $cm^{-1}$, most preferably 0.01 to 0.1 $cm^{-1}$, and an oxygen concentration of less than 2 ppm, preferably less than 0.1 ppm, more preferably less than 0.01 ppm, is added to a vessel, and the vessel then sealed. The seal may be of the recloseable type or of the single use type. There are numerous methods known in the art for sealing liquid containing vessels. Suitable for the practice of the present invention are those methods which have been developed for providing high degrees of isolation between the external environment and a contained environment. Any method known in the art for the isolation of a high purity chemical from the surrounding environment is suitable for the preparation of the alkane.

In one embodiment, the vessel is sealed by use of a mechanical valve such as a stainless steel needle valve with fluoropolymer packing; a stainless steel ball valve with fluoropolymer packing; a stainless steel check valve with fluoropolymer packing; or a greasefree Teflon stopcock.

In another embodiment, the vessel is sealed by use of a septum, preferably of fluoroelastomer such as Viton, Kalrez, or Teflon coated elastomer.

In another embodiment, the vessel is sealed by use of a fluoropolymer-lined screw cap.

In another embodiment, the vessel is sealed under vacuum. When needed, and the liquid pushed out by pressurizing with inert gas.

In an alternative to an isolating seal, the vessel can be sealably connected to a slow inert gas flow that provides a slight positive pressure of blanketing inert gas during storage and fluid removal from the container.

Representative of methods that can be applied or adapted for use in sealing the vessel are those disclosed in: Gargano et al, US 2004/0089667 A1; Krause, US 2004/0067169 A1, Hargett, U.S. Pat. No. 6,287,526 B1; Friedel et al, U.S. Pat. No. 4,993,573; Koida et al, U.S. Pat. No. 4,934,552; Schreiber, U.S. Pat. No. 4,867,354; Mabille, U.S. Pat. No. 4,830,210; Shea, U.S. Pat. No. 4,538,653; Hirota et al., U.S. Pat. No. 4,403,710; and, Trinkaus, EP 0341533B1.

Regardless of which method for sealing is selected, it is desirable that any surface exposed to the liquid alkane, or the vapor thereof, be substantially free of alkane-soluble contaminants such as grease, plasticizers, oils, or organic solvents. Suitable non-contaminating surfaces include metals such as stainless steel, glasses such as borosilicate glass, and plastics such as Teflon®, Teflon® FEP, Teflon® PFA, and ultra-high MW polyethylene. A particularly desirable sealing surface is made of polytetrafluoroethylene such as Teflon®, Viton® fluoroelastomer, or Kalrez® perfluoroelastomer. Teflon® is a trademark of the DuPont Company, Wilmington Del. Viton® and Kalrez® are trademarks of DuPont Dow Elastomers Company, Wilmington, Del. More than one type of surface can be present in a single container. For example, the container may be a glass bottle with a Teflon® cap liner or a stainless steel cylinder with Teflon™ in the valve packing.

In one embodiment of the present invention, a vessel is filled with the liquid alkane to completely fill the volume thereof, leaving no head space. In another embodiment, the vessel is partially filled leaving a headspace consisting essentially of alkane vapor. This may be accomplished by filling the vessel, cooling to solidify the alkane, evacuating the head space, sealing under vacuum, and then allowing the vessel to warm, thereby melting the alkane. In a preferred embodiment, the alkane is added to the vessel and the head space is filled with an inert gas containing less than 5 ppm, preferably less than 3 ppm, most preferably less than 1 ppm, of oxygen. Alkane vapors may remain present in the head space. Preferred inert gases include nitrogen, helium, and argon. Nitrogen is preferred. Helium may reduce the tendency toward bubble formation during use. In a more preferred embodiment, the inert gas is added to create a slight positive pressure compared to atmospheric pressure. In all methods, addition of the alkane is desirably effected in an atmosphere of a suitable inert gas with an oxygen concentration less than 5 ppm, preferably less than 3 ppm, most preferably, less than 1 ppm.

Vessels well-suited for the storage of highly purified chemicals are known in the art and available commercially. Found to be suitable in the practice of the invention are TraceClean® glass bottles (VWR catalog #15900) and Sure/Seal® bottles available from Aldrich.

EXAMPLES

In certain of the following examples, the silica gel or other adsorbent prepared as hereinabove described was combined with the indicated liquid alkane in a Trace-Clean® bottle available from VWR Scientific. The mixture was vigorously shaken for about 15 seconds. The mixture was similarly shaken each day of storage. Just prior to absorbance determination, a portion of the mixture was subject to filtration to remove adsorbent.

In the below described aging experiments, 100 ml of cyclohexane was added to a 250 ml Trace-Clean bottle under the conditions indicated. Prior to addition of the cyclohexane, the bottle was subject to three cycles of flushing and evacuation of the selected gas atmosphere. If adsorbent was used, about 70-75 ml of adsorbent was added to the bottle.

Examples 1-6 and Comparative Examples 1-4

The absorbance of as received cyclohexane (Fluka catalog #28935, purity ⌊ 99.5% by GC, b.p. 80-81° C.). according to the relative transmission method described in copending U.S. patent applications Ser. Nos. 60/575982 and 60/614747, was found to be 4.78 $cm^-$ at 193 nm.

About 600 ml of activated silica gel was added to 1250 ml of the as received cyclohexane. After filtering off the silica gel under $N_2$ in a glove box, the absorbance of the thus treated cyclohexane was found to be 0.33 $cm^{-1}$ at 193 nm. This absorbance is designated as the "Day 0" absorbance in Table 1 herein below.

In a glove bag under $N_2$, 100 ml of the silica-gel-treated cyclohexane was added to each of four 250 ml VWR® Trace-Clean® amber glass bottles (VWR catalog #15900-138). To one of said four bottles was also added 50 ml of the dried silica gel prepared hereinabove and the bottle was sealed in a nitrogen atmosphere. To a second of said four bottles was also added 50 ml of the dried silica gel prepared hereinabove and the bottle was sealed in an air atmosphere. A third of said four bottles was sealed in a nitrogen atmosphere without the addition of silica gel. The fourth of said four bottles was sealed in an air atmosphere without the addition of silica gel.

Four 250 ml VWR® TraceClean® clear glass bottles (VWR catalog #15900-130) were filled in a similar manner to the amber bottles.

Two 300 ml stainless steel cylinders (Hoke 6HD300) each fitted with a Hoke needle valve (3732M4Y) on one end and a Hoke ball valve (7115F4Y) on the opposite end were purchased from Delvalve, West Chester, Pa. The cylinder body, fittings, valves and screens were immersed in acetone for 20 minutes and then air-dried with compressed air or nitrogen. After being dried, they were immersed into a reagent grade methanol bath followed by air drying again. The cylinder was then assembled.

The cylinder assembly was pressurized by air and submerged under water for a leak test. The cylinder was removed from water and air dried with compressed air. Fifty ml of Vertrel® XF were added to the cylinder and the cylinder was shaken for a few minutes. The solvent was discarded and the wash repeated once. The cylinder was dried under vacuum overnight. In a glove bag under $N_2$, 100 ml of the treated cyclohexane was added to each of the two clean 300 ml stainless steel cylinders. To one of the two cylinders was added 50 ml of the activated silica gel which had been ground and sieved to 6 mesh so as to allow loading of the silica through the cylinder valve. No silica gel was added to the other cylinder.

Specimens were periodically extracted from each vessel for determination of VUV absorbance. Silica gel was filtered off in the glove bag under nitrogen using an 0.45 μm glass microfiber syringe filter (Whatman® Autovial® #AV125UGMF). Absorbance of the cyclohexane specimens so extracted was measured using a Varian Cary 5 UV/vis/NIR dual beam spectrometer. A zero baseline was generated from 185 to 350 nm by running a blank using two empty cuvettes. Absorbance of the samples is shown in Table 1, where "Ex" designates "Example" and "CE" designates "comparative example.".

TABLE 1

Absorbance of Cyclohexane in Air and Nitrogen

| | | | | Absorbance at 193 nm ($cm^{-1}$) | | | | |
|---|---|---|---|---|---|---|---|---|
| Cyclohexane Storage Duration | | | DAY 0 | 1 day | 1 week | 2 weeks | 1 month | 2 months |
| Brown bottle | CE-1 | Air | 0.33 | 1.04 | 1.2 | 1.05 | 1.22 | 1.18 |
| | CE-2 | Air + Silica gel | 0.33 | 1.07 | 1.35 | 1.14 | 1.04 | 1.14 |
| | EX. 1 | N2 | 0.33 | 0.32 | 0.2 | 0.29 | 0.26 | 0.35 |
| | Ex. 2 | N2 + Silica gel | 0.33 | 0.29 | 0.16 | 0.2 | 0.2 | 0.28 |
| Clear bottle | CE-3 | Air | 0.33 | 1.25 | 1.08 | 1.07 | 1.25 | 1.14 |
| | CE-4 | Air + Silica gel | 0.33 | 1.2 | 1.15 | 1.08 | 1.13 | 1.14 |
| | Ex. 3 | N2 | 0.33 | 0.3 | 0.29 | 0.26 | 0.29 | 0.22 |
| | Ex. 4 | N2 + Silica gel | 0.33 | 0.26 | 0.31 | 0.25 | 0.37 | 0.36 |
| Stainless steel | Ex. 5 | N2 | 0.33 | 0.46 | 0.56 | 0.57 | 0.53 | 0.54 |
| | Ex. 6 | N2 + Silica gel | 0.33 | 0.35 | 0.24 | 0.31 | 0.26 | 0.19 |

Examples 7 and 8

About 100 ml of activated silica gel was added to 180ml of cyclohexane in its original bottle (Fluka catalog #0028935, purity ⌊ 99.9% by GC) in a dry box. No additional effort was taken to remove air. The cyclohexane/silica gel mixture was shaken for about one minute and stored at room temperature for 4 days before being decanted for the following experiments.

Example 7

The stainless steel cylinders employed in Examples 5 and 6 were disassembled and cleaned according to the procedures described above, then reassembled. To one of the cleaned 300 ml cylinders was added about 20 ml of silica gel activated as described above, about 20 ml of activated 3A molecular sieves and 80 ml of cyclohexane (treated as described in the previous paragraph). The cylinder was sealed in a nitrogen atmosphere and stored for 5 weeks. After 5 weeks, the absorbance of the cyclohexane was 0.55 cm$^{-1}$ at 193 nm.

Example 8

To the second of the cleaned 300ml cylinders was added about 33 ml of the activated silica gel of Example 7 and 65 ml of the cyclohexane treated as in Example 7. The cylinder was sealed in a nitrogen atmosphere and stored for 5 weeks. After 5 weeks, the absorbance of the cyclohexane was 0.27 cm$^{-1}$ at 193 nm.

Examples 9 and 10, Comparative Examples 5 and 6

The equipment and procedures of Example 1 were repeated except that argon was substituted for nitrogen as indicated. In this case, the Day 0 absorbance was 0.11 cm$^{-1}$. The results are listed in Table 2.

TABLE 2

Absorbance of Cyclohexane in Air and Argon

| Cyclohexane | | Absorbance at 193 nm (cm$^{-1}$) | | |
|---|---|---|---|---|
| Storage Duration | | DAY 0 | 1 day | 2 weeks |
| Brown bottle | CE-5 Air | 0.11 | 1.16 | 1.14 |
| | CE-6 Air + Silica gel | 0.11 | 1.07 | 1 |
| | EX. 7 Ar | 0.11 | 0.07 | 0.07 |
| | Ex. 8 Ar + Silica gel | 0.11 | 0.15 | 0.14 |

Example 11

The absorbance of 10 aliquots from the same purified cyclohexane sample was determined five times on each of two days. Results are shown in Table 3. The Cary spectrophotometer was employed.

TABLE 3

| Time | A/cm @ 193 nm |
|---|---|
| Day 1 | 0.29 |
| | 0.29 |
| | 0.30 |
| | 0.30 |
| | 0.31 |
| Day 2 | 0.17 |
| | 0.17 |
| | 0.18 |
| | 0.18 |
| | 0.18 |

Example 12

Decalin (decahydronaphthalene, Fluka catalog #30490, Purity 98% by GC) as received was found to have an absorbance at 193 nm (Cary Spectrophotometer) of 60.3 cm$^{-1}$. About 300 ml of activated silica gel was added to 500 ml of the as received decalin in a TraceClean bottle (VWR Scientific) with a Teflon®-lined closure. 10 ml of so-treated decalin was transferred to a TraceClean™ vial (VWR Scientific) with a Teflon®-lined closure. After filtering the silica gel off under N$_2$ in a glove box, the absorbance of the thus treated decalin was found to be 0.57 cm$^{-1}$ at 193 nm (Cary Spectrophotometer).

The 500 ml decalin sample over silica was then allowed to sit for three months in its TraceClean bottle in a nitrogen glove box. At the end of this period, another sample of decalin was removed from the TraceClean bottle, filtered, and its absorbance measured as 0.57 cm$^{-1}$ in the Cary Spectrophotometer. A second sample of the decalin was filtered into a 20 milliliter EaglePicher, (University Drive, Phoenix Ariz.), amber glass sample vial with Teflon resin/Silicone septum cap,(Cat.#EP139-20A, purchased precleaned), The EaglePicher vial was removed from the glove box. The fluorescence oxygen probe described in Example 13 was inserted through the septum down into the decalin fluid. According to the fluorescence probe the oxygen concentration was 1.5 ppm, indicating that oxygen concentration in the decalin is below our limits of accurate detection (<2 ppm).

Example 13 and Comparative Examples 7 and 8

Oxygen concentrations were determined using a fluorescence spectrometer manufactured by Ocean Optics, Inc. (Dunedin, Fla.). The spectrometer was equipped with an 18-gauge needle probe suitable for insertion into sample vials. The needle probe was attached to the light source and spectrometer via a bifurcated fiber optic cable. The fluorescence probe must first be calibrated using samples having known oxygen concentrations.

The first calibration point was for a sample approximating 0 torr of oxygen. A 20 milliliter EaglePicher,(University Drive, Phoenix Ariz.), amber glass sample vial (Cat.#EP139-20A), supplied pre-cleaned and with a Teflon™ resin/Silicone septum cap, was opened in a nitrogen glove box and resealed so as to capture the glove box atmosphere. This vial was removed from the glove box. The oxygen fluorescence probe was inserted through the vial's septum to sample the nitrogen atmosphere in the vial. A gas-phase oxygen probe (VAC Oxygen Analyzer Model #5ANA28, from Advanced MicroInstruments, Inc., Garden Grove, Calif.) mounted in the dry box showed an oxygen concentration in the range of 0.5-1 ppm.

Air-saturated perfluorohexane was used for the high oxygen content calibration point. Perfluorohexane equilibrated with the oxygen in air (159 Torr of oxygen in air) is known to contain 104 ppm by weight O$_2$ at 20° C. (R. R. Kunz, et. al, JM$^3$ 3(1) 73-83(January 2004). The fluorescence spectrometer probe was insensitive below 1-2 ppm.

Comparative Example 7

In a nitrogen-purged dry box, as received cyclohexane (Fluka catalog #28935, purity >99.5% by GC) was transferred in about 5 seconds from the original bottle to a 20 milliliter EaglePicher, (University Drive, Phoenix Ariz.), amber glass sample vial provided pre-cleaned and with a Teflon™/Silicone septum cap,(Cat. #EP139-20A). The vial was then sealed with the septum cap, labeled and removed from the dry box. The fluorescence probe was inserted through the septum cap and the tip of the probe lowered into cyclohexane. Dissolved oxygen in the cyclohexane was measured to be 30 ppm.

Comparative Example 8

Cyclohexane treated according to the method of Example 1 was stored in a nitrogen-purged dry box for 3 months. After 3 months, still in the dry box, 15 ml of the thus stored cyclohexane was transferred to a 20 milliliter EaglePicher sample vial by a clean, dry 20 cc BD Yale Hypodermic syringe with Luer-Lok tip, (Becton Dickinson Company, Franklin Lakes, N.J.), that had a 0.2 micron PTFE Acrodisc CR25 mm Syringe Filter attached (Pall Life Sciences, East Hills, N.Y. 11548). The vial was then sealed with a Teflon® resin/Silicone® septum cap, labeled and removed from the dry box. The sample was transferred into the lab hood where the septum cap was removed exposing its contents to ambient air (room temperature 20° C., Relative Humidity 63%). The fluid in the vial was gently swirled, one wrist rotation, and then its contents left exposed to air for 5 minutes. The vial was then resealed, leaving room air as the cover gas inside the vial over the purified cyclohexane. 16 hours later the Ocean Optics fluorescence probe was inserted through the septum down into the cyclohexane fluid where the dissolved oxygen content was found to be 136 ppm.

Example 13

A second 15 ml aliquot of the cyclohexane of Comparative Example 8 was handled in a similar manner to that of Comparative Example 8 except that there was no exposure to air before determination of oxygen concentration. The oxygen concentration in the Cyclohexane was 1.3 ppm, that is, at the limit of detectability of the probe.

Example 14 and Comparative Examples 9

Relative nitrogen solubility in decalin and cyclohexane were used to estimate the solubility constant for oxygen in decalin. At a temperature of 138° C., nitrogen solubilities in cyclohexane and trans-decalin were reported as 71.5 and 34.9 ppm by weight, respectively (Gao et al., J. Chem. Eng. Data, 44(2), p185-189, 1999). Assuming that oxygen and nitrogen solubilities trend similarly, oxygen solubility in decalin was estimated to be 45.5 ppm by weight at 20° C. when equilibrated with air.

Decalin under air was received from Fluka (catalog number 30490, Purity >98% by GC). The as-received decalin was transferred from the original bottle to a pre-cleaned 20 milliliter EaglePicher vial (Cat#EP139-20A). Using the fluorescence probe, the dissolved oxygen content in the as-received decalin was found to be 60 ppm.

Comparative Example 9

In the nitrogen-purged dry box, a 15 ml aliquot of the purified decalin of Example 12 which had been stored for 3 months in nitrogen was poured into a clean, dry 20 cc BD Yale hypodermic syringe provided with a Luer-Lok tip, (Becton Dickinson Company, Franklin Lakes, N.J.), fitted with a 0.2 micron PTFE Acrodisc CR25mm Syringe Filter (Pall Life Sciences, East Hills, N.Y.) and then injected into a pre-cleaned 20 milliliter EaglePicher sample vial. The vial was then sealed with a Teflon®/Silicone® septum cap, labeled and removed from the $N_2$-purged Dry Box. The sample was transferred to a lab hood where the septum cap was removed exposing the decalin to ambient air (room temperature about 20° C., Relative Humidity 63%). The fluid in the vial was gently swirled, one wrist rotation, and then left exposed to air for 5 minutes. The vial was resealed, leaving room air as the cover gas inside the vial over the purified decalin. The fluorescence probe was inserted through the septum down into the decalin where dissolved the oxygen content was found to be 55 ppm.

Example 14

The method of Comparative Example 9 was followed except that the specimen was not exposed to the air. The oxygen content of the purified decalin was 1.5 ppm, that is, at the limit of detectability of the probe.

What is claimed is:

1. A method comprising subjecting a sealable vessel having an inner surface that is substantially free of alkane soluble contaminants to flushing with an inert gas to form an atmosphere of inert gas, charging in the atmosphere of inert gas a liquid alkane to said flushed vessel such that the liquid alkane contacts the inner surface, and sealing the vessel, said liquid alkane being characterized by a spectroscopic absorbance at 193 nm of less than 1 $cm^{-1}$ and an oxygen concentration of less than about 2 ppm, said inert gas having an oxygen concentration of less than 5 parts per million.

2. The method of claim 1 wherein said liquid alkane is characterized by a spectroscopic absorbance at 193 nm of 0.01-0.5 $cm^{-1}$ and an oxygen concentration of less than about 0.1 ppm.

3. The method of claim 1 wherein said inert gas is nitrogen, argon, helium, or a mixture thereof.

4. The method of claim 3 wherein said adsorbent comprises activated silica gel.

5. The method of claim 1 further comprising adding an inert gas to produce a pressure greater than atmospheric pressure.

6. The method of claim 1 further comprising adding an adsorbent to said vessel prior to sealing.

7. The method of claim 1 wherein said inner surface comprises silicate glass, fluoropolymer or stainless steel.

8. The method of claim 1 wherein said inner surface is silicate glass.

* * * * *